United States Patent
Park et al.

(10) Patent No.: US 11,062,788 B2
(45) Date of Patent: Jul. 13, 2021

(54) STT-MRAM FAILED ADDRESS BYPASS CIRCUIT AND STT-MRAM DEVICE INCLUDING SAME

(71) Applicant: Industry-University Cooperation Foundation Hanyang University, Seoul (KR)

(72) Inventors: Sang-Gyu Park, Seoul (KR); Dong-Gi Lee, Daegu (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 24 days.

(21) Appl. No.: 16/491,648

(22) PCT Filed: Mar. 16, 2018

(86) PCT No.: PCT/KR2018/003067
§ 371 (c)(1),
(2) Date: Sep. 6, 2019

(87) PCT Pub. No.: WO2018/169335
PCT Pub. Date: Sep. 20, 2018

(65) Prior Publication Data
US 2020/0013479 A1  Jan. 9, 2020

(30) Foreign Application Priority Data

Mar. 17, 2017 (KR) .................. 10-2017-0033701

(51) Int. Cl.
*G11C 11/00* (2006.01)
*G11C 29/00* (2006.01)
(Continued)

(52) U.S. Cl.
CPC ............ *G11C 29/88* (2013.01); *G11C 11/165* (2013.01); *G11C 11/1653* (2013.01);
(Continued)

(58) Field of Classification Search
CPC ............................ G11C 29/88; G11C 11/165
(Continued)

(56) References Cited

U.S. PATENT DOCUMENTS 9,412,935 B1 * 8/2016 Lin .................... H01L 43/08
2004/0037112 A1 * 2/2004 Ooishi ................ G11C 29/816
365/185.09
(Continued)

FOREIGN PATENT DOCUMENTS

KR   10-0888847 B1   3/2009
KR   10-1098302 B1   12/2011
(Continued)

OTHER PUBLICATIONS

International Search Report of PCT/KR2018/003067 dated Jul. 12, 2018.

*Primary Examiner* — Hoai V Ho
*Assistant Examiner* — Minh Dinh
(74) *Attorney, Agent, or Firm* — Sughrue Mion, PLLC

(57) ABSTRACT

A spin transfer torque magnetic random access memory (STT-MRAM) device according to the present embodiment comprises: an STT-MRAM memory array which includes a data storage unit for storing data, a defect area address storage unit for storing an address of a defect area, and a spare area for storing data of a failed area; and a bypass determination unit which includes a volatile information storage element for storing the address of the defect area, stored in the defect area address storage unit and provided thereto, and when memory array access occurs, compares an access address with the address of the defect area stored in the volatile information storage element and causes the memory array access to bypass to the spare area.

12 Claims, 3 Drawing Sheets

(51) Int. Cl.
 *G11C 11/16* (2006.01)
 *G11C 14/00* (2006.01)
 *G11C 29/44* (2006.01)
(52) U.S. Cl.
 CPC ...... *G11C 11/1673* (2013.01); *G11C 11/1675* (2013.01); *G11C 14/0036* (2013.01); *G11C 29/44* (2013.01)
(58) Field of Classification Search
 USPC ........................................................ 365/148
 See application file for complete search history.

(56) References Cited

U.S. PATENT DOCUMENTS

| | | |
|---|---|---|
| 2004/0109360 A1* | 6/2004 | Bateman .............. G11C 29/848 365/189.02 |
| 2009/0003056 A1 | 1/2009 | Chun et al. |
| 2011/0063897 A1 | 3/2011 | Ong |
| 2013/0322160 A1* | 12/2013 | Kim ...................... G11C 29/04 365/154 |
| 2014/0078842 A1 | 3/2014 | Oh et al. |
| 2015/0143165 A1 | 5/2015 | Cho |
| 2016/0062830 A1 | 3/2016 | Cha et al. |
| 2018/0137916 A1* | 5/2018 | Salama .............. G11C 13/0007 |

FOREIGN PATENT DOCUMENTS

| | | |
|---|---|---|
| KR | 10-2012-0053953 A | 5/2012 |
| KR | 10-2014-0131207 A | 11/2014 |
| KR | 10-2015-0057155 A | 5/2015 |
| KR | 10-2016-0024472 A | 3/2016 |

* cited by examiner

STT-MRAM FAILED ADDRESS BYPASS CIRCUIT AND STT-MRAM DEVICE INCLUDING SAME

CROSS REFERENCE TO RELATED APPLICATIONS

This application is a National Stage of International Application No. PCT/KR2018/003067 filed Mar. 16, 2018, claiming priority based on Korean Patent Application No. 10-2017-0033701 filed Mar. 17, 2017.

TECHNICAL FIELD

The present invention relates to a circuit for bypassing a defect area of a spin transfer torque-magnetic random access memory (STT-MRAM) and an STT-MRAM device including the circuit.

BACKGROUND ART

Among semiconductor memories, dynamic random access memories (DRAMs) currently occupy the largest portion. However, DRAMs have a problem with scaling down and the resulting problem of maintaining the capacitance of a capacitor for storing information. To overcome these limitations, new forms of devices have been developed. A next-generation device which attracts the most attention is a magnetic random access memory (MRAM) based on tunneling magnetoresistance.

The MRAM is a non-volatile device which takes advantage of a change in magnetic resistance caused by the arrangement of two ferromagnetic layers constituting a magnetic tunnel junction (MTJ), which is basically composed of a laminated structure of a ferromagnetic layer, an insulating layer, and a ferromagnetic layer. One of the two ferromagnetic layers is a pinned layer (PL) having a fixed magnetization direction, and the other is a free layer (FL) having a magnetization direction which is changed by a current flowing therethrough.

When electrons passing through the first ferromagnetic layer pass through the insulating layer used as a tunneling barrier, a tunneling probability varies according to the magnetization direction of the second ferromagnetic layer. In other words, when the magnetization directions of the two ferromagnetic layers are parallel to each other, a tunneling current is maximized, and when the magnetization directions are antiparallel, the tunneling current is minimized. Therefore, it is possible to read stored data on the basis of a difference in current of each case.

The MRAM generally uses the spin transfer torque (STT) phenomenon to write data therein. The STT phenomenon refers to the phenomenon where a change in angular momentum is instantaneously caused when a spin-polarized current goes through a ferromagnetic body. In other words, data is written using the phenomenon where the magnetization direction of a ferromagnetic body is aligned in the spin direction of a high-density current having a polarized spin direction unless the magnetization direction of the ferromagnetic body does not coincide with the spin direction of the current when the current flows into the ferromagnetic body.

In an MTJ used in a semiconductor memory, when electrons of a current of a threshold or higher flow from a PL to an FL, the magnetization direction of the FL becomes identical to the magnetization direction of the PL due to the flow of electrons whose spin directions are aligned in the magnetization direction of the PL. On the contrary, when electrons of a current of the threshold or higher flow from the FL to the PL, spin accumulation occurs in the interface between the PL and the FL, and the magnetization direction of the FL becomes antiparallel to that of the PL. Therefore, it is possible to record data using the magnetization direction of the FL.

DISCLOSURE

Technical Problem

When a magnetic random access memory (MRAM) device is formed of an integrated high-density array, a defect may occur in device reading and/or writing for several reasons. In devices such as a conventional dynamic random access memory (DRAM), there are circuits for bypassing a memory area at which a defect has occurred and taking a detour to another area when an attempt is made to access the address.

Conventional devices store an address of an area at which a defect has occurred in a fuse or an electrically erasable programmable read-only memory (EEPROM) which is a non-volatile memory. In the case of storing an address of an area at which a defect has occurred in a fuse, it is difficult to handle a defect which is newly detected when memory packaging is finished after initial operation. In the case of storing an address of an area at which a defect has occurred in an EEPROM, it is necessary to generate a high voltage by additionally forming a circuit, which is uneconomical in terms of die size and power consumption.

The present invention is directed to providing a MRAM device which solves the above-described problems of the conventional art and provides unique technical effects that the conventional art does not have.

Technical Solution

One aspect of the present invention provides a spin transfer torque magnetic random access memory (STT-MRAM) device including: an STT-MRAM memory array including a data storage unit for storing data, a defect area address storage unit for storing a defect area address, and a spare area for storing data of a defect area; and a bypass determination unit including a volatile information storage element for storing the defect area address, which is stored in the defect area address storage unit and provided, and configured to compare, when memory array access occurs, an access address with the defect area address stored in the volatile information storage element and cause the memory array access to take a detour to the spare area.

Another aspect of the present invention provides a circuit for bypassing a defect area of an STT-MRAM, the circuit including address storage capacitors configured to store respective bits of a defect area address, address comparison units having one end to which one bit of an access address is provided and the other end to which one bit stored in the address capacitor is provided and configured to perform an address comparison logic operation, and an address coincidence logic operation unit configured to receive output signals of the address comparison units and determine whether the access address coincides with the defect area address. When the access address coincides with the defect area address, the address coincidence logic operation unit activates a spare area and causes access to the defect area address to take a detour to the activated spare area.

Advantageous Effects

According to the present embodiment, since the address of a defect area is stored in an information storage element in a memory array, it is unnecessary to form an additional component. Also, since it is unnecessary to form an additional power providing circuit required for operation, it is economical in terms of die size and power consumption.

MODES OF THE INVENTION

Figure 1:
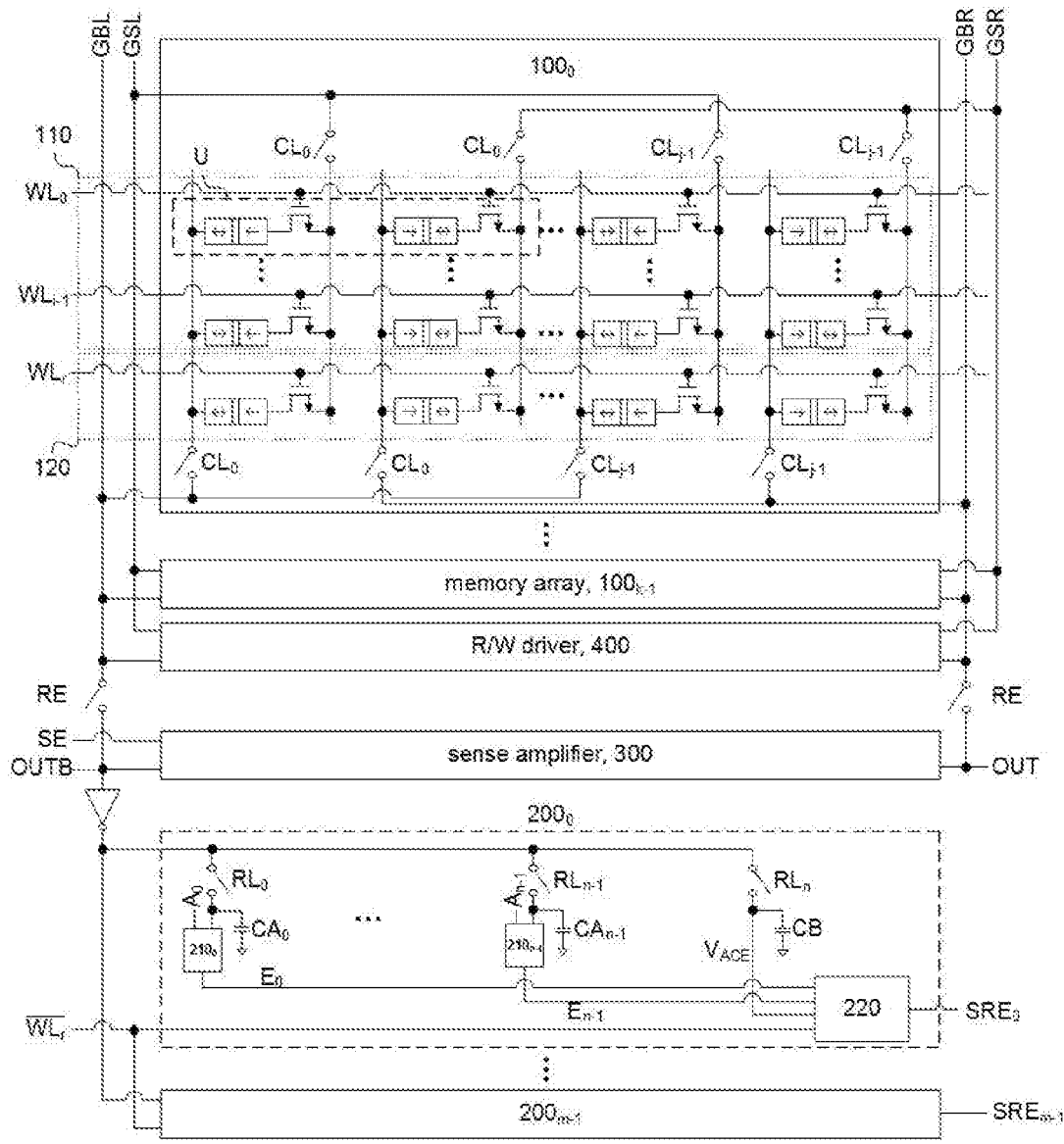
FIG. 1 is a block diagram showing an overview of a spin transfer torque magnetic random access memory (STT-MRAM) device according to the present embodiment.

A subscript may be added to reference symbols of components which perform identical or similar functions. However, when it is unnecessary to distinguish between the components, the components may be collectively indicated by a symbol excluding the subscript, and when it is necessary to distinguish between the components, the subscript may be added for description.

Elements, such as a switch, included in the drawings which are appended and described herein show elements that are turned on or activated by a high-state signal as examples. However, this is for the purpose of facilitating description and not for limiting the scope of the present invention. Therefore, an N-type metal oxide semiconductor field effect transistor (MOSFET) can be replaced by a P-type MOSFET, which is easily understood by those of ordinary skill in the art.

Hereinafter, a spin transfer torque magnetic random access memory (STT-MRAM) device 10 and a circuit 200 for bypassing a defect area of an STT-MRAM according to the present embodiment will be described with reference to the accompanying drawings. FIG. 1 is a block diagram showing an overview of an STT-MRAM device 10 according to the present embodiment. Referring to FIG. 1, the STT-MRAM device 10 according to the present embodiment includes an STT-MRAM memory array 100 including a data storage unit 110 for storing data, a defect area address storage unit 120 for storing a defect area address, and a spare area for storing data of a defect area, and a bypass determination unit 200 including volatile information storage elements CA for storing the defect area address, which is stored in the defect area address storage unit 120 and provided, and configured to compare a memory array access address with the defect area address stored in the volatile information storage element and cause memory array access to take a detour to the spare area.

The circuit 200 for bypassing a defect area of an STT-MRAM according to the present embodiment includes the address storage capacitors CA configured to store respective bits of a defect area address, address comparison units 210 having one end to which one bit of an access address A is provided and the other end to which one bit stored in the address storage capacitors CA is provided and configured to perform an address comparison logic operation, and an address coincidence logic operation unit 220 configured to receive output signals of the address comparison units and determine whether the access address coincides with the defect area address. When the access address coincides with the defect area address, the address coincidence logic operation unit 220 activates a spare area and causes access to the defect area address to take a detour to the activated spare area.

Referring to FIG. 1, the STT-MRAM device 10 according to the present embodiment may include a plurality of memory arrays $100_0, \ldots,$ and $100_{k-1}$. The memory array 100 includes the data storage unit 110 for storing data.

The data storage unit 110 includes storage elements U disposed in an array to read or write one logic bit. In the embodiment shown as an example in FIG. 1, the storage elements U may have a 2-transistor 2-magnetic tunnel junction (MTJ) (2T2M) structure in which two bits which are complementary to each other are stored in order to store information of any one bit. According to the 2T2M structure, pieces of data complementary to each other may be stored in two MTJs in order to store any one bit, and information of the stored one bit may be read on the basis of a difference between the complementary pieces of information stored in the two MTJs. In the storage elements U having the 2T2M structure, since two bits complementary to each other are used, it is possible to improve a sensing margin thereof.

According to an embodiment not shown in the drawings, the data storage unit 110 may include a storage element having a 1T1M structure in which one transistor and one MTJ are used to read or write any one logic bit. According to this embodiment, it is possible to increase data storage density.

The 2T2M structure and 1T1M structure have been taken as examples above. However, the present embodiment is not limited to the structures and may use various structures of unit storage elements which have not been taken as examples.

The defect area address storage unit 120 stores an address of a defect area in the memory array 100. In an embodiment, the defect area may indicate a row, a column, etc. including a storage element in which it is not possible to read or write target data. In FIG. 1, the defect area address storage unit 120 is shown as storage elements included in one row connected to a word line WLr. According to an embodiment not shown in the drawings, however, the defect area address storage unit 120 may include storage elements included in a plurality of rows connected to a plurality of word lines.

For example, after a manufacturing process of the STT-MRAM device 10 is finished, a defect area may be detected in a test process of performing writing and reading. An address of the detected defect area may be stored in the defect area address storage unit 120 in the test process.

According to an embodiment, the defect area address storage unit 120 may further store an activation flag bit. The storage elements included in the defect area address storage unit 120 store the address of the defect area detected in the test. Before the address of the defect area is stored, random bits may be stored in the defect area address storage unit 120, and the random bits may coincide with an address of an area which operates normally. The activation flag bit prevents malfunction caused when an address randomly stored in the defect area address storage unit 120 coincides with an address to be accessed. The activation flag bit indicates that an address stored in the defect area address storage unit 120 is the address of the defect area detected and written therein and may be written as a logic high or a logic low. As an example, the activation flag bit may be a single bit. As another example, the activation flag bit may be a plurality of bits.

The spare area (not shown) is an area for storing data to be written in the defect area and may be included in the memory array 100 together with the data storage unit 110. As will be described below, the spare area may be activated by an activation signal SRE provided by the bypass determination unit 200. In an embodiment, the spare area may store data in the same structure in which the data storage unit 110 stores data.

A read/write (R/W) driver 400 reads or writes information by providing an electrical signal to the storage elements U included in the data storage unit 110. In the process of the driver 400 reading information, a voltage formed by providing an electrical signal to the storage elements U is read by a sense amplifier 300.

The sense amplifier 300 provides a read result as corresponding outputs OUT and OUTB. In an embodiment, the sense amplifier 300 may latch up the provided signal with a signal SE and output the latched signal.

In FIG. 1, the STT-MRAM device 10 is shown to include one sense amplifier 300. According to an embodiment not shown in the drawings, a plurality of sense amplifiers may be included. When a plurality of sense amplifiers are formed and allocated to respective columns of the memory array, it is possible to increase speed.

In the embodiment shown as an example in FIG. 1, when the driver 400 writes data in the storage elements U included in the data storage unit 110, a control unit (not shown) provides a signal to a word line $WL_0$ connected to a transistor connected to a target storage element U and turns on switches $CL_0$ connected to a global bit line GBL and a global source line GSL. The driver 400 changes a magnetization direction of a free layer (FL) of an MTJ, which is a storage element, by applying a current from a pinned layer (PL) (←) of the MTJ to the FL (↔) or applying a current from the FL (↔) to the PL (←) and thereby may write target information.

In the embodiment shown as an example in FIG. 1, when the driver 400 reads data from a storage element included in the data storage unit 110, the control unit (not shown) provides a signal to a word line $WL_0$ connected to a transistor connected to a target storage element U and connects the global bit line GBL and the sense amplifier 300 by turning on the switches $CL_0$ connected to the global bit line GBL and the global source line and a switch RE. The driver 400 provides a voltage in any one direction of the storage elements U.

When a magnetization direction of the FL (↔) coincides with a magnetization direction of the PL (←), a resistance value of the MTJ is smaller than that of a case in which the magnetization direction of the FL (↔) differs from the magnetization direction of the PL (←). Therefore, the sense amplifier may detect information stored in the storage element by sensing the change. However, the above-described process is only an example of operations, and operations may be performed in another sequence.

Figure 2A:
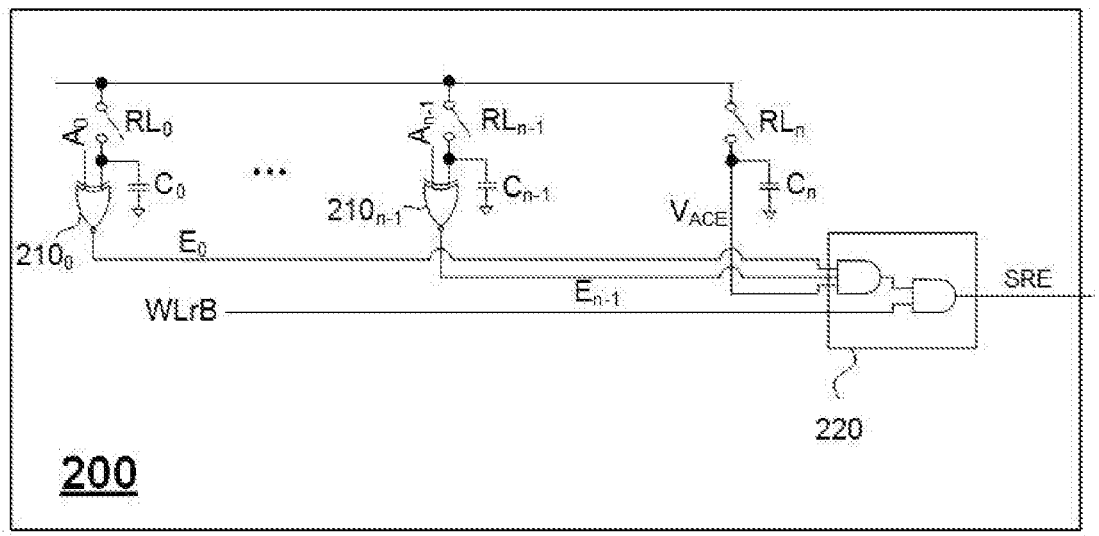
FIGS. 2A and 2B are a set of schematic circuit diagrams of a bypass determination unit according to the present embodiment.
Figure 2B:
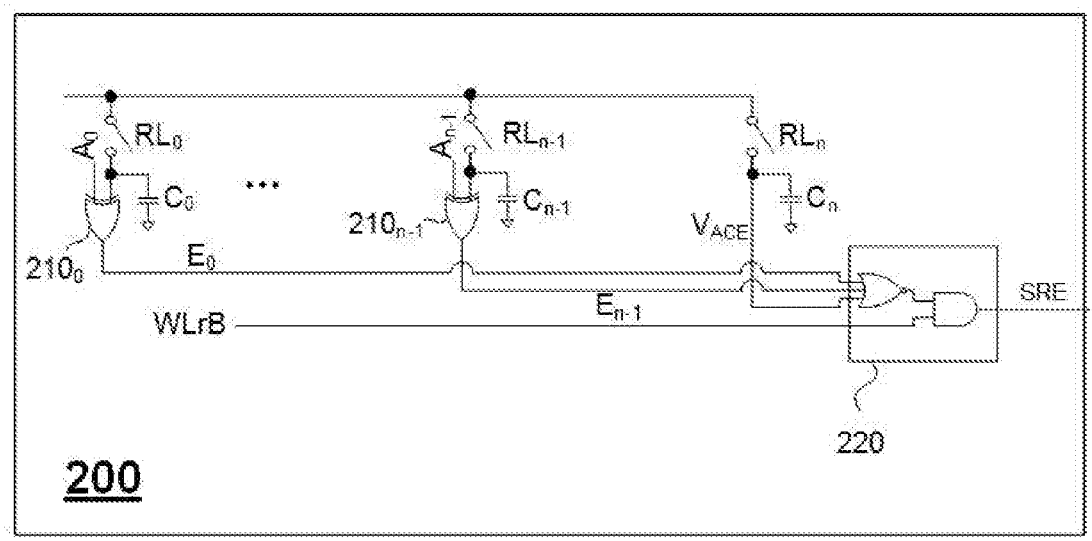

Operation of the bypass determination unit 200 will be described below with reference to FIGS. 1 to 3. FIGS. 2A and 2B are a set of schematic circuit diagrams of the bypass determination unit 200 according to the present embodiment. Referring to FIGS. 1, 2A, and 2B, when the STT-MRAM device 10 is booted up or reset, the control unit (not shown) turns on the respective switches by providing a signal to the global bit line (GBL), the global source line (GSL), and the word line $WL_T$ connected to the storage elements of the defect area address storage unit 120, and the driver 400 provides an electrical signal to the storage elements included in the defect area address storage unit 120. The control unit (not shown) turns on the switch RE so that the sense amplifier 300 may detect information stored in the defect area address storage unit 120.

The control unit controls a switch RL so that respective bits of information output by the sense amplifier 300 may be stored in the address information storage capacitors CA. Also, the control unit stores an activation flag bit, which is included in the defect area address storage unit 120, in an activation capacitor CB. In the embodiment shown in the drawing, when there is a single activation flag bit, the activation capacitor CB may be one capacitor. In another embodiment not shown in the drawings, when there are a plurality of activation flag bits, the activation capacitor CB may be a plurality of capacitors.

The address information storage capacitors CA and the activation capacitor CB included in the STT-MRAM device 10 may be actual capacitors that may have a non-ideal characteristic such as charge leakage. To prevent information loss caused by the unideal characteristic, the address information storage capacitors CA and the activation capacitor CB may be refreshed. As an embodiment, the control unit may perform the refresh by reading an address stored in the defect area address storage unit 120 and the activation flag bit and storing the address and the activation flag bit respectively in the address information storage capacitors CA and the activation capacitor CB. As another embodiment, the bypass determination unit may further include a refresh unit for refreshing information stored in the address information storage capacitors CA and the activation capacitor CB.

The bypass determination unit 200 includes the address comparison units 210 to which one bit of the access address A is provided as one input and a bit stored in the address storage capacitors CA is provided as another input. In an embodiment, when the bit $A_0$ of the access address coincides with the bit stored in the address information storage capacitor $CA_0$, the address comparison unit 210 outputs an activation signal $E_0$.

In the embodiment shown as an example in FIG. 2A, the address comparison units 210 may include an exclusive NOR gate which receives one bit of the access address as one input and a bit stored in an address storage capacitor as another input and provides the activation signal E in a logic high state when the two bits coincide with each other.

The address coincidence logic operation unit 220 provides the spare area activation signal SRE in a high state when activation signals E provided by the address comparison units 210 and activation flag bits are all in logic high states.

In the embodiment shown as an example in FIG. 2A, when the STT-MRAM device 10 is booted up or reset, a WLrB signal which is obtained by inverting a WLr signal provided to a word line of the defect area address storage unit 120 in the case of reading a defect area address stored in the defect area address storage unit 120 may be provided to the address coincidence logic operation unit 220. The WLr signal is provided in a logic high state in the case of storing an address of a defect area in the defect area address storage unit 120 or reading a defect area address stored in the defect area address storage unit 120 when the STT-MRAM device 10 is booted up or reset.

In the case of reading a defect area address stored in the defect area address storage unit 120 when the STT-MRAM device 10 is booted up or reset, the WLr signal is a logic high, and the WLrB signal is a logic low. Therefore, the bypass determination unit 200 may be deactivated.

However, in the process of comparing the address A provided for memory access with the defect area address, the WLrB signal is maintained in a logic high state. Therefore, the bypass determination unit 200 may provide the spare area activation signal SRE according to a comparison result between the access address A and an address stored in the capacitors.

In the embodiment shown as an example in FIG. 2B, the address comparison units 210 may be exclusive OR gates which provide the activation signal E in a logic low state when the bit of an access address coincides with the bit stored in the address information storage capacitor CA.

When the activation signal E is provided in a logic low state, the address coincidence logic operation unit 220 may be implemented as a NOR gate. For example, when activation signals E provided by the address comparison units 210 and activation flag bits are all in a logic low state, the address coincidence logic operation unit 220 may provide the spare area activation signal SRE for activating the spare area in a high state.

The address coincidence logic operation unit 220 may further include an AND gate, to which a WLrB signal obtained by inverting a WLr signal provided to a word line of the defect area address storage unit 120 may be provided when the STT-MRAM device 10 is booted up or reset. Since the WLrB signal is the same as the WLrB signal in the previous embodiment, description thereof is omitted.

FIGS. 2A and 2B are only examples, and those of ordinary skill in the art can easily derive a configuration for performing the same or similar function from the above-described embodiments.

The spare area (not shown) is activated by the spare area activation signal SRE. When the spare area is activated by the spare area activation signal SRE, the data storage unit 110 is deactivated to prevent access to a defect area included in the data storage 110. Therefore, the bypass determination unit 200 may prevent memory access to the defect area and cause the memory access to take a detour to the spare area.

Simulation Example

Figure 3:
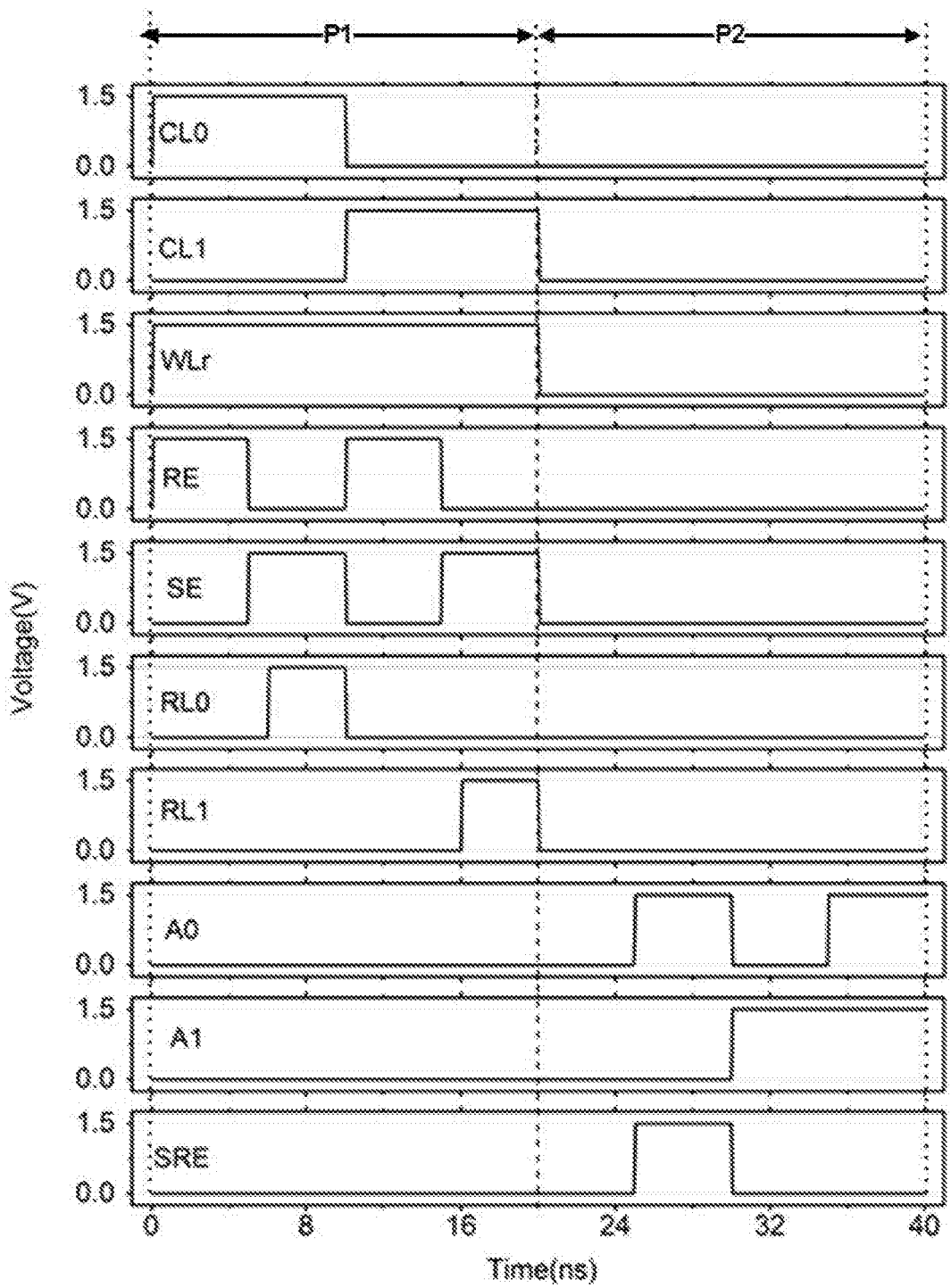
FIG. 3 is a timing diagram showing operation of the STT-MRAM device according to the present embodiment.

FIG. 3 is a timing diagram showing operation of the STT-MRAM device 10 according to the present embodiment. Referring to FIG. 3, the STT-MRAM device 10 according to the present embodiment may operate in a first phase P1 for storing an address in the address storage capacitors CA or in a second phase P2 for comparing an address requested for memory access with the defect area address stored in the address storage capacitors CA. Although not shown in the timing diagram, a process of storing an activation flag bit in the defect area address storage unit 120 to the activation capacitor CB may be further performed in the first phase P1.

It is assumed that an address of a defect area is [10] as a test result of the STT-MRAM device 10 and [10] is stored in the defect area address storage unit 120.

In the first phase P1, an activation signal is provided to the word line WLr connected to the defect area address storage unit 120, and the switches CL0 connected to the global bit line GBL and the global source line GSL are turned on. Subsequently, a signal RE is provided to provide information stored in a defect area address storage element to the sense amplifier 300, and the sense amplifier receives a signal SE and latches up and outputs the provided information.

The corresponding information is stored by a signal RL0 in the address storage capacitor CA0. Through a like process, the information stored in the second defect area address storage element is stored in the address storage capacitor CA1 by turning on the switch CL1. Therefore, [10] is stored in each of the address storage capacitors CA0 and CA1. Also, an activation flag bit is stored in the activation capacitor CB.

In the second phase P2 proceeding in succession, when the memory access address [10] is provided to A0 and A1, the bypass determination unit outputs the spare area activation signal SRE so that memory access to the defect area may take a detour to the spare area.

Although the present invention has been described above with reference to embodiments shown in the drawings to aid in understanding the present invention, the embodiments are merely examples, and those of ordinary skill in the art would understand that various modifications and equivalents can be made from the embodiments. Therefore, the technical scope of the present invention should be determined by the following claims.

The invention claimed is:

1. A spin transfer torque magnetic random access memory (STT-MRAM) device comprising:
   an STT-MRAM memory array including a data storage unit configured to store data, a defect area address storage unit configured to store a defect area address, and a spare area configured to store data of a defect area; and
   a bypass determination unit including a volatile information storage element configured to store the defect area address, which is stored in the defect area address storage unit and provided, and configured to compare, when memory array access occurs, an access address with the defect area address stored in the volatile information storage element and cause the memory array access to take a detour to the spare area,
   wherein the bypass determination unit comprises:
   a volatile information storage element configured to store bit information of the defect area address;
   an address comparison unit configured to receive the bit information stored in the volatile information storage element and bit information of the access address, and perform a logic operation of determining whether pieces of the received bit information coincide with each other; and
   a spare area activation unit configured to receive a logic operation result of the address comparison unit and activate the spare area.

2. The STT-MRAM device of claim 1, wherein the bypass determination unit further comprises an activation flag capacitor configured to store an activation flag bit; and
   activation of the bypass determination unit is controlled by the activation flag bit stored in the activation flag capacitor.

3. The STT-MRAM device of claim 1, wherein when the device is booted up or reset, the defect area address stored in the defect area address storage unit is provided to the volatile information storage element and stored therein.

4. The STT-MRAM device of claim 3, wherein when the device is booted up or reset, a deactivation signal for deactivating the bypass determination unit is provided to the bypass determination unit.

5. The STT-MRAM device of claim 1, wherein the memory array has a 2-transistor 2-magnetic tunnel junction (MTJ) (2T2M) structure for storing two pieces of data complementary to each other.

6. The STT-MRAM device of claim 1, wherein the memory array has a 1-transistor 1-magnetic tunnel junction (MTJ) (1T1M) structure for storing single-bit data.

7. The STT-MRAM device of claim 1, further comprising:
   a sense amplifier configured to read the data stored in the memory array; and a driver configured to provide an electrical signal for reading information stored in the memory array or writing information in the memory array.

8. A circuit for bypassing a defect area of a STT-MRAM, the circuit comprising:
   address storage capacitors configured to store respective bits of a defect area address;
   address comparison units having one end to which one bit of an access address is provided and the other end to which one bit stored in the address storage capacitors is provided and configured to perform an address comparison logic operation; and
   an address coincidence logic operation unit configured to receive output signals of the address comparison units and determine whether the access address coincides with the defect area address,
   wherein when the access address coincides with the defect area address, the address coincidence logic operation unit activates a spare area and causes access to the defect area address to take a detour to the activated spare area.

9. The circuit of claim 8, further comprising an activation capacitor configured to store an activation bit,
   wherein activation of the circuit is controlled by the activation bit stored in the activation capacitor.

10. The circuit of claim 8, wherein the address comparison units are logic gates which provide activation signals when signals provided as inputs are identical to each other.

11. The circuit of claim 10, wherein when the activation signals provided by the address comparison units coincide with each other, the address coincidence logic operation unit activates the spare area and causes access to the defect area address to take a detour to the activated spare area.

12. A spin transfer torque magnetic random access memory (STT-MRAM) device comprising:
   an STT-MRAM memory array including a data storage unit configured to store data, a defect area address storage unit configured to store a defect area address, and a spare area configured to store data of a defect area; and
   a bypass determination unit including a volatile information storage element configured to store the defect area address, which is stored in the defect area address storage unit and provided, and configured to compare, when memory array access occurs, an access address with the defect area address stored in the volatile information storage element and cause the memory array access to take a detour to the spare area,
   wherein when the device is booted up or reset, the defect area address stored in the defect area address storage unit is provided to the volatile information storage element and stored therein, and a deactivation signal for deactivating the bypass determination unit is provided to the bypass determination unit.

* * * * *